United States Patent
Wehlus et al.

(10) Patent No.: US 9,882,158 B2
(45) Date of Patent: Jan. 30, 2018

(54) ORGANIC OPTOELECTRONIC COMPONENT AND METHOD FOR PRODUCING AN ORGANIC OPTOELECTRONIC COMPONENT

(71) Applicant: OSRAM OLED GmbH, Regensburg (DE)

(72) Inventors: Thomas Wehlus, Lappersdorf (DE); Erwin Lang, Regensburg (DE); Richard Baisl, Regensburg (DE); Daniel Riedel, Regensburg (DE); Arndt Jaeger, Regensburg (DE); Andreas Rausch, Regensburg (DE); Silke Scharner, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/116,227

(22) PCT Filed: Feb. 18, 2015

(86) PCT No.: PCT/EP2015/053430
§ 371 (c)(1),
(2) Date: Aug. 3, 2016

(87) PCT Pub. No.: WO2015/124636
PCT Pub. Date: Aug. 27, 2015

(65) Prior Publication Data
US 2016/0359130 A1 Dec. 8, 2016

(30) Foreign Application Priority Data
Feb. 24, 2014 (DE) .................... 10 2014 102 346

(51) Int. Cl.
*H01L 51/50* (2006.01)
*H01L 51/52* (2006.01)
(Continued)

(52) U.S. Cl.
CPC ........ *H01L 51/5088* (2013.01); *H01L 27/302* (2013.01); *H01L 51/0003* (2013.01);
(Continued)

(58) Field of Classification Search
CPC ............... H01L 51/5088; H01L 27/302; H01L 51/0003; H01L 51/2012; H01L 51/5056;
(Continued)

(56) References Cited

U.S. PATENT DOCUMENTS

2007/0222379 A1 9/2007 Yamazaki et al.
2008/0299382 A1* 12/2008 Moon .................... B82Y 20/00
428/323
2012/0193619 A1 8/2012 Taka et al.

FOREIGN PATENT DOCUMENTS

DE 102010033026 A1 2/2012
DE 102010033025 A1 8/2012
(Continued)

OTHER PUBLICATIONS

German Search Report based on application No. 10 2014 102 346.3 (10 pages) dated Jan. 30, 2015 (for reference purpose only).
(Continued)

*Primary Examiner* — Peter Bradford
(74) *Attorney, Agent, or Firm* — Viering, Jentschura & Partner mbB

(57) ABSTRACT

In various embodiments, an organic optoelectronic component is provided. The organic optoelectronic component may include a first electrode, an organic functional layer structure over the first electrode, and a second electrode over the organic functional layer structure. Optionally, the organic functional layer structure includes a charge carrier pair generation layer structure. At least one of the electrodes and/or the charge carrier pair generation layer structure
(Continued)

includes electrically conductive nanostructures, the surfaces of which are at least partially coated with a coating material.

14 Claims, 2 Drawing Sheets

(51) Int. Cl.
*H01L 27/30* (2006.01)
*H01L 51/00* (2006.01)
*H01L 51/56* (2006.01)
*B82Y 20/00* (2011.01)

(52) U.S. Cl.
CPC ...... *H01L 51/5012* (2013.01); *H01L 51/5056* (2013.01); *H01L 51/5072* (2013.01); *H01L 51/5092* (2013.01); *H01L 51/5206* (2013.01); *H01L 51/5221* (2013.01); *H01L 51/5237* (2013.01); *H01L 51/5253* (2013.01); *H01L 51/5259* (2013.01); *H01L 51/5268* (2013.01); *H01L 51/5278* (2013.01); *H01L 51/56* (2013.01); *B82Y 20/00* (2013.01); *H01L 2251/5369* (2013.01)

(58) Field of Classification Search
CPC ............. H01L 51/5072; H01L 51/5092; H01L 51/5206; H01L 51/5221; H01L 51/5237; H01L 51/5253; H01L 51/5259; H01L 51/5268; H01L 51/5278; H01L 51/56; H01L 2251/5369
See application file for complete search history.

(56) References Cited

FOREIGN PATENT DOCUMENTS

| | | |
|---|---|---|
| EP | 1997814 A1 | 12/2008 |
| JP | 2009251386 A | 10/2009 |

OTHER PUBLICATIONS

International Search Report based on application No. PCT/EP2015/053430 (5 pages + 2 pages of English translation) dated Aug. 21, 2015.

\* cited by examiner

ORGANIC OPTOELECTRONIC COMPONENT AND METHOD FOR PRODUCING AN ORGANIC OPTOELECTRONIC COMPONENT

RELATED APPLICATIONS

The present application is a national stage entry according to 35 U.S.C. § 371 of PCT application No.: PCT/EP2015/053430 filed on Feb. 18, 2015, which claims priority from German application No.: 10 2014 102 346.3 filed on Feb. 24, 2014, and is incorporated herein by reference in its entirety.

TECHNICAL FIELD

Various embodiments may relate to an organic optoelectronic component and to a method for producing an organic optoelectronic component.

BACKGROUND

Organic-based optoelectronic components, for example organic light-emitting diodes (OLEDs), are being used increasingly widely in general lighting, for example as a flat light source. An organic optoelectronic component, for example an OLED, may include an anode and a cathode with an organic functional layer system between them. The organic functional layer system may include one or more emitter layers, in which light is generated, one or more charge carrier pair generation layers ("charge generating layer", CGL), and one or more electron barrier layers, also referred to as hole transport layers (HTL), and one or more hole barrier layers, also referred to as electron transport layers (ETL), in order to direct the flow of current.

The electrodes, for example the anode and/or the cathode, may for example include as electrically conductive elements silver nanowires, which may for example consist of elemental silver which has been grown in wire form. Typical nanowires are in this case a few tens of nm thick and several tens of µm long. In order to form the corresponding electrodes, these are distributed over a surface so that a network of silver nanowires, which is suitable for surface powering of OLEDs, is formed One problem which may arise with electrodes having silver nanowires is that, because of the work function in the case of silver, injection of holes into the hole transport layer of the OLED may take place inefficiently. The problem can be solved by heavy doping of the hole transport layers adjacent to the silver nanowires. In this case, the doping may be greater than would be necessary in principle for pure surface conduction. Yet since the dopants and/or the doping per se are relatively expensive, instead of doping the entire HTL an additional hole injection layer (HIL) may be inserted at the silver nanowire/hole transport layer interface in order to save on dopant. This, however, may increase the process complexity in contrast to the single-layer approach in which the HIL and HTL are present in combination. As an alternative or in addition, hole-injecting polymers, for example PEDOT:PSS, may be added to the silver nanowire solution. However, the added polymers may not be compatible with every HTL material and/or may reduce the lifetime of the OLED.

Another problem may involve the processability of the material. For example, silver nanowires are inclined to agglomerate, for example form clumps. The clumped silver nanowires can no longer straightforwardly be applied uniformly on the corresponding surface. This problem may, for example, be solved by adding stabilizers to a silver nanowire solution with the dissolved silver nanowires. For example, a conductive polymer, for example PEDOT:PSS, may be added to the silver nanowire solution, although this may lead to the new problems already explained above.

SUMMARY

In various embodiments, an organic optoelectronic component is provided, which is particularly efficient and/or which can be produced in a straightforward and/or economical way.

In various embodiments, a method for producing an organic optoelectronic component is provided, which contributes to the organic optoelectronic component being particularly efficient, and/or which can be carried out in a straightforward and/or economical way.

In various embodiments, an organic optoelectronic component is provided which includes a first electrode, an organic functional layer structure over the first electrode, and a second electrode over the organic functional layer structure. At least one of the electrodes includes electrically conductive nanostructures, the surfaces of which are at least partially coated with a coating material.

In various embodiments, an organic optoelectronic component is provided which includes a first electrode, an organic functional layer structure, having a charge carrier pair generation layer structure (CGL), over the first electrode, and a second electrode over the organic functional layer structure. The charge carrier pair generation layer structure includes electrically conductive nanostructures, the surfaces of which are at least partially coated with a coating material.

The coating material on the nanostructures can contribute to the organic optoelectronic component being particularly efficient, and/or being able to be produced in a straightforward and/or economical way. The coating of the nanostructures with the coating material will also be referred to below as functionalization of the nanostructures and/or as functionalization of the surfaces of the nanostructures.

With the aid of the coating material, the interaction of the nanostructures with their environment can be influenced. For example, by the coating material better injection of electrons and/or holes into subsequently vapor-deposited organic functional material can be achieved, so that the process complexity is reduced and/or an additional injection layer between the nanostructures and the HTL is not necessary. As an alternative or in addition, stabilization of the nanostructures still present in solution can be achieved and/or aggregation and/or agglomeration of the nanostructures can be reduced or prevented by the coating material. This can contribute to an improvement of the processability of the material and/or to a reduction of the process complexity.

In various embodiments, the charge carrier pair generation layer structure includes a first sublayer, which includes nanostructures coated with a first coating material. Furthermore, the charge carrier pair generation layer structure includes a second sublayer, which includes nanostructures coated with a second coating material. The second sublayer is formed over the first sublayer. For example, the sublayers are stacked on one another.

In various embodiments one of the two sublayers is a hole injection layer and the other of the two sublayers is an electron injection layer. For example, the hole injection layer is produced by means of the first coating material and the electron injection layer sublayer is produced by means of the second coating material. As an alternative thereto, however, the hole injection layer may also be produced by means of the second coating material and the electron injection layer sublayer may be produced by means of the first coating material. If the nanostructures of the two sublayers are functionalized differently by means of the first and second coating materials, so that the hole injection layer and an electron injection layer sublayer are formed, then a CGL, in particular a nanostructures CGL, can thereby be formed straightforwardly.

In various embodiments, the nanostructures include nanowires, nanotubes, nanoparticles and/or nanodots. The nanostructures respectively have in principle at least one external dimension which measures only a few nanometers. The external dimension may for example be a side length, a circumference or a diameter, for example a maximum diameter, of the corresponding nanostructure. The external dimension may for example be from 0.1 nm to 10 nm, for example from 1 nm to 8 nm. Otherwise, the nanostructures may also have larger external dimensions. For example, a nanotube and/or a nanowire may have a diameter of between 0.1 nm and 10 nm and a length of several micrometers.

In various embodiments, the coating material includes at least one functional group which is selected from aromatic, heteroaromatic, electron-withdrawing, electron donating, polar, nonpolar or fluorinated groups.

In various embodiments, the coating material is used in order to functionalize the surface of the nanostructures. This functionalization is carried out by means of functional groups which impart the desired properties to the nanostructure. These functional groups may for example have polar, nonpolar, charged, electron-withdrawing or electron-donating properties.

In various embodiments, the coating material includes molecules which contain the desired functional groups. In various embodiments, these molecules are organic compounds which contain one or more functional groups. In addition, these molecules may contain groups which mediate the bonding to the surface of the nanostructures. This bonding may be covalent or noncovalent. Noncovalent interactions include electrostatic interactions, hydrogen bonding and van der Waals interactions. In various embodiments, the group which interacts with the surface of the nanostructures and the functional group may be identical.

In various embodiments, the groups which can mediate the bonding to the surface of the nanostructures include, without being restricted thereto, thiol groups (—SH), hydroxyl groups (—OH) and carboxyl groups (—COOH).

In various embodiments, the surfaces of the nanostructures are functionalized by means of thiolalkyl. In other words, before bonding to the surfaces, the coating material includes optionally substituted alkane thiols for binding functional groups to the surfaces of the nanostructures. Alkane thiols bind via the sulfur atom covalently to the surface and in this case form self-assembling monolayers (SAMs). The alkyl radicals which are bonded to the surfaces have in various embodiments from 1 to 30 carbon atoms and may be straight-chained or branched, saturated or unsaturated. If the alkyl radicals are additionally substituted, the substituents are for example selected from aromatic or heteroaromatic groups. As an alternative or in addition, substitution with electron-withdrawing and/or electron-donating groups is possible, so that the electron transport properties and/or hole transport properties of the corresponding layers can be controlled deliberately. Substitution with polar, nonpolar or fluorinated groups, which may likewise be carried out as an alternative or in addition, allows optimization for use in special solvents.

In various embodiments, aromatic groups include, without being restricted thereto: C6-C14 aryl, 5-14 membered heteroaryl, in which from 1 to 4 ring atoms are independently nitrogen, oxygen or sulfur, arylalkyl, heteroarylalkyl, in which all the aforementioned radicals may be substituted or unsubstituted. In various embodiments, the aromatic radicals are substituted or unsubstituted phenols. In various embodiments, the heteroaromatic radicals are selected from the group consisting of pyridine, pyrrole, thienyl, mono-, di-, tri- or tetra-azole, mono-, di-, tri- or tetra-azine, oxazole, in which all the aforementioned radicals may be substituted or unsubstituted.

In various embodiments, the electron-withdrawing groups include, without being restricted thereto, —CO—R', —CS—R', —NO$_2$, —N$^+$(alkyl)$_3$, —NH$_3^+$, —CN, -halogen, —C{halogen}$_3$, with R'=H, alkyl, OH, O-alkyl, SH, S-alkyl, halogen.

In various embodiments, the electron-donating groups include, without being restricted thereto, —NH-alkyl, —NHCO-alkyl, —OCO-alkyl, —N(alkyl)$_2$, —NH$_2$, —OH, —O-alkyl, —SCO-alkyl, —OCS-alkyl, —SH, —SO$_3$H, —S-alkyl.

In various embodiments, the alkyl groups include for example C1-12 Alkyl. In various embodiments, the alkyl groups include for example methyl, ethyl, propyl, butyl, isopropyl, or tert-butyl.

In various embodiments, the halogen groups include for example fluorine, chlorine, bromine or iodine.

In various embodiments, in which one or more of the aforementioned aromatic or heteroaromatic radicals are substituted, the substituents are respectively independently selected from the group consisting of the aforementioned electron-withdrawing and electron-donating groups, linear or branched C1-12 alkyl, C2-C12 alkenyl, C2-C12 alkynyl, C3-C8 cycloalkyl and 5-14 membered heteroalicyclyl, in which from 1 to 4 ring atoms are independently nitrogen, oxygen or sulfur.

In various embodiments, a method for producing an organic optoelectronic component is provided. In the method, the first electrode is formed. The organic functional layer structure is formed over the first electrode. The second electrode is formed over the organic functional layer structure. At least one of the electrodes includes electrically conductive nanostructures, the surfaces of which are at least partially coated with the coating material.

In various embodiments, a method for producing an organic optoelectronic component is provided. In the method, the first electrode is formed. The organic functional layer structure having the charge carrier pair generation layer structure is formed over the first electrode. The second electrode is formed over the organic functional layer structure. The charge carrier pair generation layer structure includes electrically conductive nanostructures, the surfaces of which are at least partially coated with the coating material.

In various embodiments, the coating material is dissolved in a first liquid and is thus applied onto the nanostructures. The first liquid may, for example, be a first solvent.

In various embodiments, the nanostructures are dissolved in a second liquid during the application of the coating material. The second liquid may for example be the same as the first liquid, or the second liquid may be a different liquid. The second liquid may, for example, be a second solvent.

In various embodiments, the coated nanostructures are dissolved in a liquid during the formation of the electrode or of the charge carrier pair generation layer structure. The liquid may for example be the first liquid, the second liquid and/or a third liquid. The third liquid may, for example, be a third solvent.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the appended drawings which form part of this description and in which specific embodiments in which the invention can be carried out are shown for illustration. In this regard, direction terminology such as "up", "down", "forward", "backward", "front", "rear", etc. is used with reference to the orientation of the figure or figures being described. Since constituent parts of embodiments can be positioned in a number of different orientations, the direction terminology is used for illustration and is in no way restrictive. It is to be understood that other embodiments may be used and structural or logical modifications may be carried out, without departing from the protective scope of the present invention. It is to be understood that the features of the various embodiments described herein may be combined with one another, unless specifically indicated otherwise. The following detailed description is therefore not to be interpreted in a restrictive sense, and the protective scope of the present invention is defined by the appended claims.

In the scope of this description, terms such as "connected", "attached" or "coupled" are used to describe both direct and indirect connection, a direct or indirect attachment and direct or indirect coupling. In the figures, elements which are identical or similar are provided with identical references, insofar as this is expedient.

An organic optoelectronic component may be an organic component emitting electromagnetic radiation or an organic component absorbing electromagnetic radiation. An organic component absorbing electromagnetic radiation may, for example, be an organic solar cell. An organic component emitting electromagnetic radiation may, for example, be an electromagnetic radiation-emitting organic semiconductor component and/or an electromagnetic radiation-emitting organic diode or an electromagnetic radiation-emitting organic transistor. The radiation may for example be light in the visible range, UV light and/or infrared light. In this context, the organic component emitting electromagnetic radiation may, for example, be configured as an organic light-emitting diode (OLED) or as an organic light-emitting transistor. The organic light-emitting component may be part of an integrated circuit. Furthermore, a multiplicity of organic light emitting components may be provided, for example fitted in a common housing.

Figure 1:
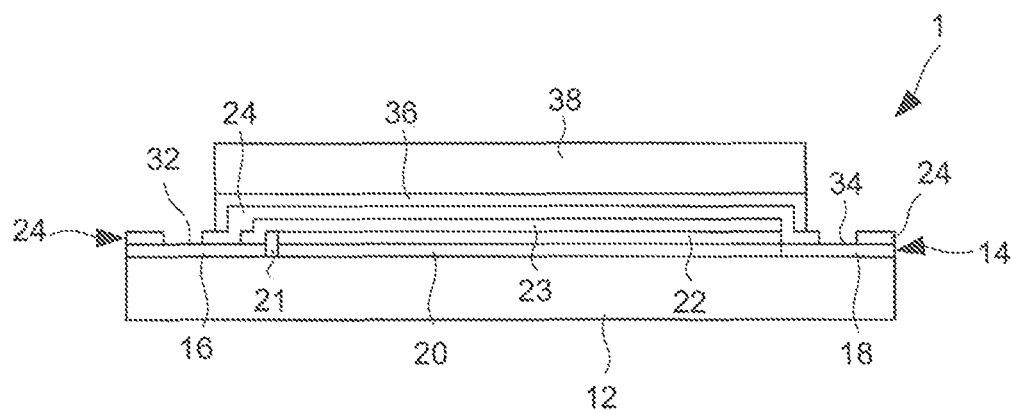
FIG. 1 shows an embodiment of an organic optoelectronic component.

FIG. 1 shows an organic optoelectronic component 1. The organic optoelectronic component 1 includes a carrier 12, for example a substrate. An optoelectronic layer structure is formed on the carrier 12.

The optoelectronic layer structure includes a first electrode layer 14, which includes a first contact section 16, a second contact section 18 and a first electrode 20. The second contact section 18 is electrically coupled to the first electrode 20 of the optoelectronic layer structure. The first electrode 20 is electrically insulated from the first contact section 16 by means of an electrical insulation barrier 21. An optically functional layer structure of the optoelectronic layer structure, in particular an organic functional layer structure 22, is formed over the first electrode 20. The organic functional layer structure 22 may for example include one, two or more sublayers, as explained in more detail below with reference to FIG. 2. A second electrode 23 of the optoelectronic layer structure, which is electrically coupled to the first contact section 16, is formed over the organic functional layer structure 22. The first electrode 20 is used, for example, as an anode or cathode of the optoelectronic layer structure. The second electrode 23 is used, in a manner corresponding to the first electrode, as a cathode or anode of the optoelectronic layer structure.

An encapsulation layer 24 of the optoelectronic layer structure, which encapsulates the optoelectronic layer structure, is formed over the second electrode 23 and partially over the first contact section 16 and partially over the second contact section 18. In the encapsulation layer 24, a first recess of the encapsulation layer 24 is formed over the first contact section 16 and a second recess of the encapsulation layer 24 is formed over the second contact section 18. A first contact region 32 is exposed in the first recess of the encapsulation layer 24, and a second contact region 34 is exposed in the second recess of the encapsulation layer 24. The first contact region 32 is used for electrical contacting of the first contact section 16, and the second contact region 34 is used for electrical contacting of the second contact section 18.

A bonding layer 36 is formed over the encapsulation layer 24. The bonding layer 36 includes for example a bonding agent, for example an adhesive, for example a laminating adhesive, and/or a coating and/or a resin. A cover body 38 is formed over the bonding layer 36. The bonding layer 36 is used for fastening the cover body 38 on the encapsulation layer 24. The cover body 38 includes, for example, glass and/or metal. For example, the cover body 38 may be formed essentially from glass and include a thin metal layer, for example a metal foil, and/or a graphite layer, for example a graphite laminate, on the glass body. The cover body 38 is used to protect the organic optoelectronic component 1, for example against the effects of mechanical force from the outside. Furthermore, the cover body 38 may be used to distribute and/or dissipate heat which is generated in the organic optoelectronic component 1. For example, the glass of the cover body 38 may be used as protection against external influences, and the metal layer of the cover body 38 may be used to distribute and/or dissipate the heat given off during operation of the organic optoelectronic component 1.

The encapsulation layer 24, the bonding layer 36 and/or the cover body 38 may, for example, also be referred to as a cover. As an alternative, the organic optoelectronic component 1 may also be formed without the carrier 12 and/or the cover. As an alternative or in addition, the cover may also extend as far as an edge the carrier 12, in which case the contact regions 32, 34 may for example be exposed in corresponding contact recesses in the cover.

Figure 2:
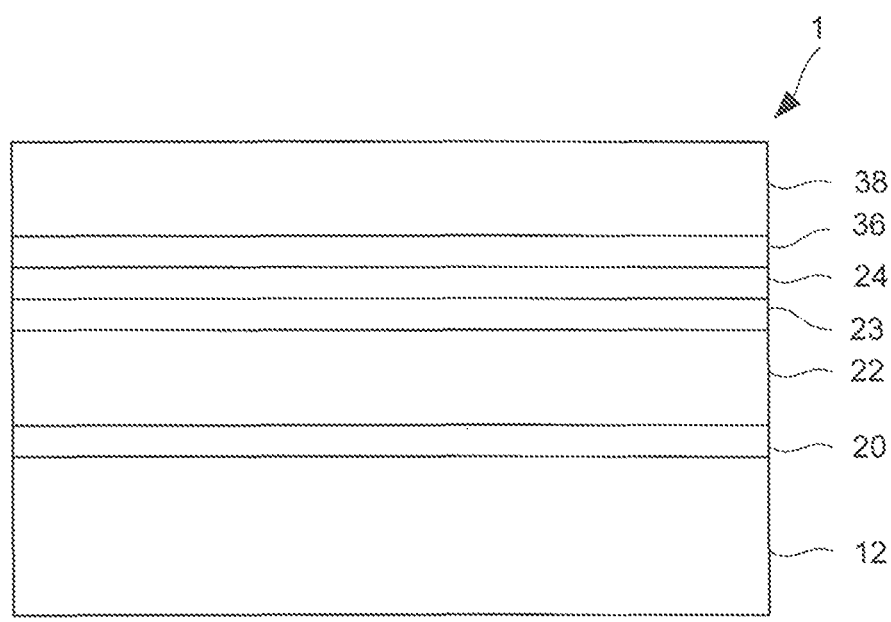
FIG. 2 shows an embodiment of a layer structure of an organic optoelectronic component.

FIG. 2 shows a sectional representation of a layer structure of an embodiment of an organic optoelectronic component, for example of the organic optoelectronic component 1 explained above. The organic optoelectronic component 1 may be configured as a top emitter and/or a bottom emitter. If the organic optoelectronic component 1 is configured as a top emitter and a bottom emitter, the organic optoelectronic component 1 may be referred to as an optically transparent component, for example a transparent organic light-emitting diode.

The organic optoelectronic component 1 includes the carrier 12 and an active region over the carrier 12. A first barrier layer (not represented), for example a first barrier thin film, may be formed between the carrier 12 and the active region. The active region includes the first electrode 20, the organic functional layer structure 22 and the second electrode 23. The encapsulation layer 24 is formed over the active region. The encapsulation layer 24 may be configured as a second barrier layer, for example as a second barrier thin film. The cover body 38 is arranged over the active region and optionally over the encapsulation layer 24. The cover body 38 may, for example, be arranged on the encapsulation layer 24 by means of the bonding layer 36.

The active region is an electrically and/or optically active region. The active region is, for example, the region of the organic optoelectronic component 1 in which electrical current for operation of the organic optoelectronic component 1 flows, and/or in which electromagnetic radiation is generated or absorbed.

The organic functional layer structure 22 may include one, two or more functional layer structure units and one, two or more intermediate layers between the layer structure units.

The carrier 12 may be configured so as to be translucent or transparent. The carrier 12 is used as a carrier element for electronic elements or layers, for example light-emitting elements. The carrier 12 may for example include or be formed from glass, quartz and/or a semiconductor material, or any other suitable material. Furthermore, the carrier 12 may include or be formed from a plastic film or a laminate having one or more plastic films. The plastic may include one or more polyolefins. Furthermore, the plastic may include polyvinyl chloride (PVC), polystyrene (PS), polyester and/or polycarbonate (PC), polyethylene terephthalate (PET), polyether sulfone (PES) and/or polyethylene naphthalate (PEN). The carrier 12 may include or be formed from a metal, for example copper, silver, gold, platinum, iron, for example a metal compound, for example steel. The carrier 12 may be configured as a metal foil or metal-coated sheet. The carrier 12 may be a part of or form a mirror structure. The carrier 12 may include a mechanically rigid region and/or a mechanically flexible region, or be formed in such a way.

The first electrode 20 may be configured as an anode or as a cathode. The first electrode 20 may be configured so as to be translucent or transparent. The first electrode 20 includes an electrically conductive material, for example metal and/or a transparent conductive oxide (TCO) or a layer stack of a plurality of layers, which include metals or TCOs. The first electrode 20 may for example include a layer stack of a combination of a layer of a metal on a layer of a TCO, or vice versa. An example is a silver layer which is applied onto an indium tin oxide (ITO) layer (Ag on ITO) or ITO/Ag/ITO multilayers.

For example, Ag, Pt, Au, Mg, Al, Ba, In, Ca, Sm or Li as well as compounds, combinations or alloys of these materials, may be used as the metal.

Transparent conductive oxides are transparent conductive materials, for example metal oxides, for example zinc oxide, tin oxide, cadmium oxide, titanium oxide, indium oxide or indium tin oxide (ITO). Besides binary metal-oxygen compounds, for example ZnO, $SnO_2$, or $In_2O_3$, ternary metal-oxygen compounds, for example AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the TCO group.

As an alternative or in addition to the materials mentioned, the first electrode 20 may include: nanostructures, for example networks of metallic nanowires and/or nanoparticles, for example of silver, networks of nanotubes, graphene particles and/or graphene layers, and/or networks of semiconducting nanowires. For example, the first electrode 20 may include or be formed from one of the following structures: a network of metallic nanowires, for example of Ag, which are combined with conductive polymers, a network of carbon nanotubes which are combined with conductive polymers, and/or graphene layers and composites. Furthermore, the first electrode 20 may include electrically conductive polymers or transition metal oxides.

The first electrode 20 may for example have a layer thickness in a range of from 10 nm to 500 nm, for example from 25 nm to 250 nm, for example from 50 nm to 100 nm.

The first electrode 20 may include a first electrical terminal, to which a first electrical potential can be applied. The first electrical potential may be provided by an energy source (not represented), for example by a current source or a voltage source. As an alternative, the first electrical potential may be applied to the carrier 12 and fed indirectly to the first electrode 20 via the carrier 12. The first electrical potential may, for example, be the ground potential or another predetermined reference potential.

The organic functional layer structure 22 may include a hole injection layer, a hole transport layer, one or more emitter layers, in the case of a plurality of emitter layers a charge carrier pair generation layer structure (CGL) between the emitter layers, an electron transport layer and/or an electron injection layer.

The hole injection layer may be formed on or over the first electrode 20. The hole injection layer may include or be formed from one or more of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)-benzidine); beta-NPB (N,N'-bis(naphthalen-2-yl)-N,N'-bis(phenyl)-benzidine); TPD (N,N'-bis(3-methylphenyl)-N,N'-bis(phenyl)-benzidine); spiro-TPD (N,N'-bis(3-methylphenyl)-N,N'-bis(phenyl)-benzidine); spiro-NPB (N,N'-bis(naphthalen-1-yl)-N,N'-bis(phenyl)-spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis(phenyl)-9,9-diphenyl-fluorene); spiro-TAD (2,2',7,7'-tetrakis(n,n-diphenylamino)-9,9'-spirobifluorene); 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N,N'-bis-naphthalen-2-yl-N,N'-bis-phenyl-amino)-phenyl]-9H-fluorene; N,N' bis(phenanthren-9-yl)-N,N'-bis(phenyl)-benzidine; 2,7 bis[N,N-bis(9,9-spiro-bifluorene-2-yl)-amino]-9,9-spiro-bifluorene; 2,2'-bis[N,N-bis(biphenyl-4- yl)amino]9,9-spiro-bifluorene; 2,2'-bis(N,N-di-phenyl-amino)9,9-spiro-bifluorene; di-[4-(N,N-ditolyl-amino)-phenyl]cyclohexane; 2,2',7,7'-tetra(N,N-di-tolyl)amino-spiro-bifluorene; and/or N,N,N',N'-tetra-naphthalen-2-yl-benzidine.

The hole injection layer may have a layer thickness in a range of from approximately 10 nm to approximately 1000 nm, for example in a range of from approximately 30 nm to approximately 300 nm, for example in a range of from approximately 50 nm to approximately 200 nm.

The hole transport layer may be formed on or over the hole injection layer. The hole transport layer may include or be formed from one or more of the following materials: NPB (N,N'-bis(naphthalen-1-yl)-N,N'-bis(phenyl)-benzidine); beta-NPB (N,N'-bis(naphthalen-2-yl)-N,N'-bis(phenyl)-benzidine); TPD (N,N'-bis(3-methylphenyl)-N,N'-bis(phenyl)-benzidine); spiro-TPD (N,N'-bis(3-methylphenyl)-N,N'-bis(phenyl)-benzidine); spiro-NPB (N,N'-bis(naphthalen-1-yl)-N,N'-bis(phenyl)-Spiro); DMFL-TPD (N,N'-bis(3-methylphenyl)-N,N'-bis(phenyl)-9,9-dimethyl-fluorene); DMFL-NPB (N,N'-bis(naphthalen-1-yl)-N,N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis(phenyl)-9,9-diphenyl-fluorene); spiro-TAD (2,2',7,7'-tetrakis(N,N-diphenylamino)-9,9'-spirobifluorene); 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N,N'-bis-naphthalen-2-yl-N,N'-bis-phenyl-amino)-phenyl]-9H-fluorene; N,N' bis(phenanthren-9-yl)-N,N'-bis(phenyl)-benzidine; 2,7-bis[N,N-bis(9,9-spiro-bifluorene-2-yl)-amino]-9,9-spiro-bifluorene; 2,2'-bis[N,N-bis(biphenyl-4-yl)amino]9,9-spiro-bifluorene; 2,2'-bis(N,N-diphenyl-amino)9,9-spiro-bifluorene; di-[4-(N,N-ditolyl-amino)-phenyl]cyclohexane; 2,2',7,7'-tetra(N,N-di-tolyl)amino-spiro-bifluorene; and N,N,N',N'-tetra-naphthalen-2-yl-benzidine.

The hole transport layer may have a layer thickness in a range of from approximately 5 nm to approximately 50 nm, for example in a range of from approximately 10 nm to approximately 30 nm, for example approximately 20 nm.

The one or more emitter layers, for example having fluorescent and/or phosphorescent emitters, may be formed on or over the hole transport layer. The emitter layer may include organic polymers, organic oligomers, organic monomers, nonpolymeric organic small molecules, or a combination of these materials. The emitter layer may include or be formed from one or more of the following materials: organic or organometallic compounds such as derivatives of polyfluorene, polythiophene and polyphenylene (for example 2- or 2,5-substituted poly-p-phenylene vinylene), as well as metal complexes, for example iridium complexes such as blue phosphorescent FIrPic (bis(3,5-difluoro-2-(2-pyridyl)phenyl-(2-carboxypyridyl)-iridium(III)), green phosphorescent Ir(ppy)$_3$ (tris(2-phenylpyridine)iridium (III)), red phosphorescent Ru(dtb-bpy)$_3$*2(PF$_6$) (tris[4,4'-di-tert-butyl-(2,2')-bipyridine]ruthenium(III)complex) and blue fluorescent DPAVBi (4,4-bis[4-(di-p-tolylamino)styryl] biphenyl), green fluorescent TTPA (9,10-bis[N,N-di(p-tolyl) amino]anthracene) and red fluorescent DCM2 (4-dicyanomethylene)-2-methyl-6-julolidyl-9-enyl-4H-pyrane) as nonpolymeric emitters. Such nonpolymeric emitters may, for example, be deposited by means of thermal evaporation. Polymer emitters may furthermore be used, which may for example be deposited by means of a wet chemical method, for example a spin coating method. The emitter materials may be embedded in a suitable way in a matrix material, for example a technical ceramic or a polymer, for example an epoxide, or a silicone.

The emitter layer may have a layer thickness in a range of from approximately 5 nm to approximately 50 nm, for example in a range of from approximately 10 nm to approximately 30 nm, for example approximately 20 nm.

The emitter layer may include emitter materials emitting in one color or different colors (for example blue and yellow or blue, green and red). As an alternative, the emitter layer may include a plurality of sublayers which emit light of different colors. Mixing of the different colors may lead to the emission of light with a white color impression. As an alternative or in addition, a converter material may be arranged in the beam path of the primary emission generated by these layers, which material at least partially absorbs the primary radiation and emits secondary radiation with a different wavelength, so that a white color impression is obtained from (not yet white) primary radiation by the combination of primary radiation and secondary radiation.

If a plurality of emitter layers are formed, for example emitter layers which emit light with a different color, then a CGL may respectively be formed between two emitter layers. The CGL may consist of a heavily doped pn junction. The CGL includes, for example, a p-doped charge carrier pair generation layer and an n-doped charge carrier pair generation layer, which are in direct physical contact with one another so that a pn junction is clearly formed.

In the pn junction, a space charge zone is formed in which electrons of the n-doped charge carrier pair generation layer migrate into the p-doped charge carrier pair generation layer. This generates a potential discontinuity in the pn junction, or a built-in voltage. When a voltage is applied to the pn junction in the reverse direction, Wannier-Mott excitons are generated in the space charge zone, which can generate electromagnetic radiation (for example visible light) by means of recombination in the emitter layers. The potential discontinuity, or the built-in voltage, can be influenced by means of the work function, the doping of the layers, and the formation of interfacial dipoles at the pn junction by means of the substances used.

The p-doped and n-doped charge carrier pair generation layers may respectively consist of one or more organic and/or inorganic substances (matrix). One or more organic or inorganic substances (dopants) may be added to the respective matrix in order to increase the conductivity of the matrix. This doping may generate electrons (n-doped; dopants, for example metals with a low work function, for example Na, Ca, Cs, Li, Mg or compounds thereof, for example Cs$_2$CO$_3$, Cs$_3$PO$_4$, or organic dopants) or holes (p-doped; dopant, for example transition metal oxides, for example MoO$_x$, WO$_x$, VO$_x$, organic compounds, for example Cu(I)pFBz, F4-TCNQ, or organic dopants) as charge carriers in the matrix. As a substance of the hole transport layer over or on the hole-conducting charge carrier pair generation layer, an organic substance may for example be used, for example αNPD.

The charge carrier pair generation layer is capable of generating electron/hole pairs, separating them from one another and injecting electrons and holes in opposite directions into the diodes. In this way, continuous charge transport by series connection of the emitter layers is possible.

The electron transport layer may be formed, for example deposited, on or over the emitter layer(s). The electron transport layer may include or be formed from one or more of the following materials: NET-18; 2,2',2"-(1,3,5-benzin-etriyl)tris(1-phenyl-1-H-benzimidazole); 2-(4-biphenylyl)-

5-(4-tert-butylphenyl)-1,3,4-oxadiazole-2,9-dimethyl-4,7-diphenyl-1,10-phenanthroline (BCP); 8-hydroxyquinolinolato-lithium, 4-(naphthalen-1-yl)-3,5-diphenyl-4H-1,2,4-triazole; 1,3-bis[2-(2,2'-bipyridine-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridine-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyl-dipyrenylphosphine oxide; naphthalenetetracarboxylic dianhydride or imides thereof; perylenetetracarboxylic dianhydride or imides thereof; and substances based on siloles having a silacyclopentadiene unit.

The electron transport layer may have a layer thickness in a range of from approximately 5 nm to approximately 50 nm, for example in a range of from approximately 10 nm to approximately 30 nm, for example approximately 20 nm.

The electron injection layer may be formed on or over the electron transport layer. The electron injection layer may include or be formed from one or more of the following materials: NDN-26, MgAg, $Cs_2CO_3$, $Cs_3PO_4$, Na, Ca, K, Mg, Cs, Li, LiF; 2,2',2"-(1,3,5-benzinetriyl)-tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato-lithium, 4-(naphthalen-1-yl)-3,5-diphenyl-4H-1,2,4-triazole; 1,3-bis[2-(2,2'-bipyridine-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridine-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyl-dipyrenylphosphine oxide; naphthalenetetracarboxylic dianhydride or imides thereof; perylenetetracarboxylic dianhydride or imides thereof; and substances based on siloles having a silacyclopentadiene unit.

The electron injection layer may have a layer thickness in a range of from approximately 5 nm to approximately 200 nm, for example in a range of from approximately 20 nm to approximately 50 nm, for example approximately 30 nm.

In the case of an organic functional layer structure 22 having two or more organic functional layer structure units, corresponding intermediate layers may be formed between the organic functional layer structure units. The organic functional layer structure units may respectively be configured individually per se according to one configuration of the organic functional layer structure 22 explained above. The intermediate layer may be configured as an intermediate electrode. The intermediate electrode may be electrically connected to an external voltage source. The external voltage source may, for example, provide a third electrical potential to the intermediate electrode. The intermediate electrode may also, however, not include an external electrical terminal, for example with the intermediate electrode having a floating electrical potential.

The organic functional layer structure unit may for example have a layer thickness of at most approximately 3 µm, for example a layer thickness of at most approximately 1 µm, for example a layer thickness of at most approximately 300 nm.

The organic optoelectronic component 1 may optionally include further functional layers, for example arranged on or over the one or more emitter layers or on or over the electron transport layer. The further functional layers may for example be internal or external input/output coupling structures, which may further improve the functionality and therefore the efficiency of the organic optoelectronic component 1.

The second electrode 23 may be configured according to one of the configurations of the first electrode 20, in which case the first electrode 20 and the second electrode 23 may be configured identically or differently. The second electrode 23 may be configured as an anode or as a cathode. The second electrode 23 may have a second electrical terminal, to which a second electrical potential can be applied. The second electrical potential may be provided by the same energy source or a different energy source to the first electrical potential. The second electrical potential may be different to the first electrical potential. The second electrical potential may, for example, have a value such that the difference from the first electrical potential has a value in a range of from approximately 1.5 V to approximately 20 V, for example a value in a range of from approximately 2.5 V to approximately 15 V, for example a value in a range of from approximately 3 V to approximately 12 V.

The encapsulation layer 24 may also be referred to as thin-film encapsulation. The encapsulation layer 24 may be configured as a translucent or transparent layer. The encapsulation layer 24 forms a barrier against chemical contaminations or atmospheric substances, in particular against water (moisture) and oxygen. In other words, the encapsulation layer 24 is configured in such a way that it cannot be penetrated, or can be penetrated at most in very small amounts, by substances that can damage the optoelectronic component, for example water, oxygen or solvent. The encapsulation layer 24 may be configured as a single layer, a layer stack or a layer structure.

The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, as well as mixtures and alloys thereof.

The encapsulation layer 24 may have a layer thickness of from fractions of nanometers to serval micrometers, for example from approximately 0.1 nm (one atomic layer) to approximately 1000 nm, for example a layer thickness of from approximately 10 nm to approximately 100 nm, for example approximately 40 nm.

The encapsulation layer 24 may include a high-index material, for example one or more materials having a high refractive index, for example having a refractive index of from 1.5 to 3, for example from 1.7 to 2.5, for example from 1.8 to 2.

Optionally, the first barrier layer on the carrier 12 may be configured according to one configuration of the encapsulation layer 24.

The encapsulation layer 24 may for example be formed by means of a suitable deposition method, for example by means of an atomic layer deposition (ALD) method, for example a plasma enhanced atomic layer deposition (PEALD) method or a plasma-less atomic layer deposition (PLALD) method, or by means of a chemical vapor deposition (CVD) method, for example a plasma enhanced chemical vapor deposition (PECVD) method or a plasma-less chemical vapor deposition (PLCVD) method, or by means of sputtering or alternatively by means of other suitable deposition methods.

Optionally, an input or output coupling layer may be configured, for example, as an external film (not represented) on the carrier 12 or as an internal output coupling layer (not represented) in the layer cross section of the optoelectronic component 1. The input/output coupling layer may include a matrix and scattering centers distributed therein, the average refractive index of the input/output coupling layer being greater than the average refractive index of the layer from which the electromagnetic radiation is provided. Furthermore, one or more antireflection layers may additionally be formed.

The bonding layer 36 may for example include an adhesive and/or a coating, by means of which the cover body 38 is arranged, for example adhesively bonded, for example on the encapsulation layer 24. The bonding layer 36 may be configured so as to be transparent or translucent. The bonding layer 36 may, for example, include electromagnetic radiation-scattering particles, for example light-scattering particles. In this way, the bonding layer 36 can act as a scattering layer and improve the hue distortion and output coupling efficiency.

As light-scattering particles, it is possible to provide dielectric scattering particles, for example consisting of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$) aluminum oxide or titanium oxide. Other particles may also be suitable, so long as they have a refractive index different to the effective refractive index of the matrix of the bonding layer 36, for example air bubbles, acrylate or hollow glass spheres. Furthermore, metallic nanoparticles, metals such as gold, silver, iron nanoparticles, or the like may for example be provided as light-scattering particles.

The bonding layer 36 may have a layer thickness of more than 1 μm, for example a layer thickness of several μm. In various embodiments, the adhesive may be a lamination adhesive.

The bonding layer 36 may have a refractive index which is less than the refractive index of the cover body 38. The bonding layer 36 may for example include a low-index adhesive, for example an acrylate, which has a refractive index of approximately 1.3. The bonding layer 36 may, however, also include a high-index adhesive, which for example includes high-index nonscattering particles and has a layer thickness-averaged refractive index which corresponds approximately to the average refractive index of the organically functional layer structure 22, for example in a range of from approximately 1.6 to 2.5, for example from 1.7 to approximately 2.0.

A so-called getter layer or getter structure, i.e. a laterally structured getter layer, (not represented) may be arranged on or over the active region. The getter layer may be configured so as to be translucent, transparent or opaque. The getter layer may include or be formed from a material which absorbs and binds substances that are harmful for the active region. A getter layer may, for example, include or be formed from a zeolite derivative. The getter layer may have a layer thickness of more than 1 μm, for example a layer thickness of several μm. In various embodiments, the getter layer may include a lamination adhesive or be embedded in the bonding layer 36.

The cover body 38 may for example be formed by a glass body, a metal foil or a sealed plastic film cover body. The cover body 38 may, for example, be arranged by means of frit bonding (glass frit bonding/glass soldering/seal glass bonding) by means of a conventional glass solder in the geometrical edge regions of the organic optoelectronic component 1 on the encapsulation layer 24, or the active region. The cover body 38 may, for example, have a refractive index (for example at a wavelength of 633 nm) of for example from 1.3 to 3, for example from 1.4 to 2, for example from 1.5 to 1.8.

The first electrode 20 and/or the second electrode 23 includes nanostructures, which are respectively coated fully or partially with a coating material. The nanostructures may for example include nanowires, nanotubes, nanoparticles and/or nanodots. The nanostructures generally have at least one external dimension which measures only a few nanometers. The external dimension may for example be a side length, a circumference or a diameter, for example a maximum diameter, of the corresponding nanostructure. The external dimension may for example be from 0.1 nm to 10 nm, for example from 1 nm to 8 nm. Otherwise, the nanostructures may also have larger external dimensions. For example, a nanotube and/or a nanowire may have a diameter of between 0.1 nm and 10 nm and a length of several micrometers.

In various embodiments, the coating material is used in order to functionalize the surface of the nanostructures. This functionalization is carried out by means of functional groups which impart the desired properties to the nanostructure. These functional groups may for example have polar, nonpolar, charged, electron-withdrawing or electron-donating properties.

In various embodiments, the coating material includes molecules which contain the desired functional groups. In various embodiments, these molecules are organic compounds which contain one or more functional groups. In addition, these molecules may contain groups which mediate the bonding to the surface of the nanostructures. This bonding may be covalent or noncovalent. Noncovalent interactions include electrostatic interactions, hydrogen bonding and van der Waals interactions. In various embodiments, the group which interacts with the surface of the nanostructures and the functional group may be identical.

In various embodiments, the groups which can mediate the bonding to the surface of the nanostructures include, without being restricted thereto, thiol groups (—SH), hydroxyl groups (—OH) and carboxyl groups (—COOH).

In various embodiments, the surfaces of the nanostructures are functionalized by means of thiolalkyl. In other words, before bonding to the surface, the coating material includes optionally substituted alkane thiols for binding functional groups to the surfaces of the nanostructures. Alkane thiols bind via the sulfur atom covalently to the surface and in this case form self-assembling monolayers (SAMs). The alkyl radicals which are bonded to the surfaces have in various embodiments from 1 to 30 carbon atoms and may be straight-chained or branched, saturated or unsaturated. If the alkyl radicals are additionally substituted, the substituents are for example selected from aromatic or heteroaromatic groups. As an alternative or in addition, substitution with electron-withdrawing and/or electron-donating groups is possible, so that the electron transport properties and/or hole transport properties of the corresponding layers can be controlled deliberately. Substitution with polar, nonpolar or fluorinated groups, which may likewise be carried out as an alternative or in addition, permits optimization for use in special solvents.

In various embodiments, aromatic groups include, without being restricted thereto: C6-C14 aryl, 5-14 membered heteroaryl, in which from 1 to 4 ring atoms are independently nitrogen, oxygen or sulfur, arylalkyl, heteroarylalkyl, in which all the aforementioned radicals may be substituted or unsubstituted. In various embodiments, the aromatic radicals are substituted or unsubstituted phenols. In various embodiments, the heteroaromatic radicals are selected from the group consisting of pyridine, pyrrole, thienyl, mono-, di-, tri- or tetra-azole, mono-, di-, tri- or tetra-azine, oxazole, in which all the aforementioned radicals may be substituted or unsubstituted.

In various embodiments, the electron-withdrawing groups include, without being restricted thereto, —CO—R', —CS—R', —NO$_2$, —N$^+$(alkyl)$_3$, —NH$_3^+$, —CN, -halogen, —C{halogen}$_3$, with R'=H, alkyl, OH, O-alkyl, SH, S-alkyl, halogen.

In various embodiments, the electron-donating groups include, without being restricted thereto, —NH-alkyl, —NHCO-alklyl, —OCO-alkyl, —N(alkyl)$_2$, —NH$_2$, —OH, —O-alkyl, —SCO-alkyl, —OCS-alkyl, —SH, —SO$_3$H, —S-alkyl.

In various embodiments of the groups described above, "alkyl" denotes C1-12 Alkyl. In various embodiments, the alkyl is for example methyl, ethyl, propyl, butyl, isopropyl, or tert-butyl.

In various embodiments, the halogen group includes for example fluorine, chlorine, bromine or iodine.

In various embodiments, in which one or more of the aforementioned aromatic or heteroaromatic radicals are substituted, the substituents are respectively independently selected from the group consisting of the aforementioned electron-withdrawing and electron-donating groups, linear or branched C1-12 alkyl, C2-C12 alkenyl, C2-C12 alkynyl, C3-C8 cycloalkyl and 5-14 membered heteroalicyclyl, in which from 1 to 4 ring atoms are independently nitrogen, oxygen or sulfur.

Figure 3:
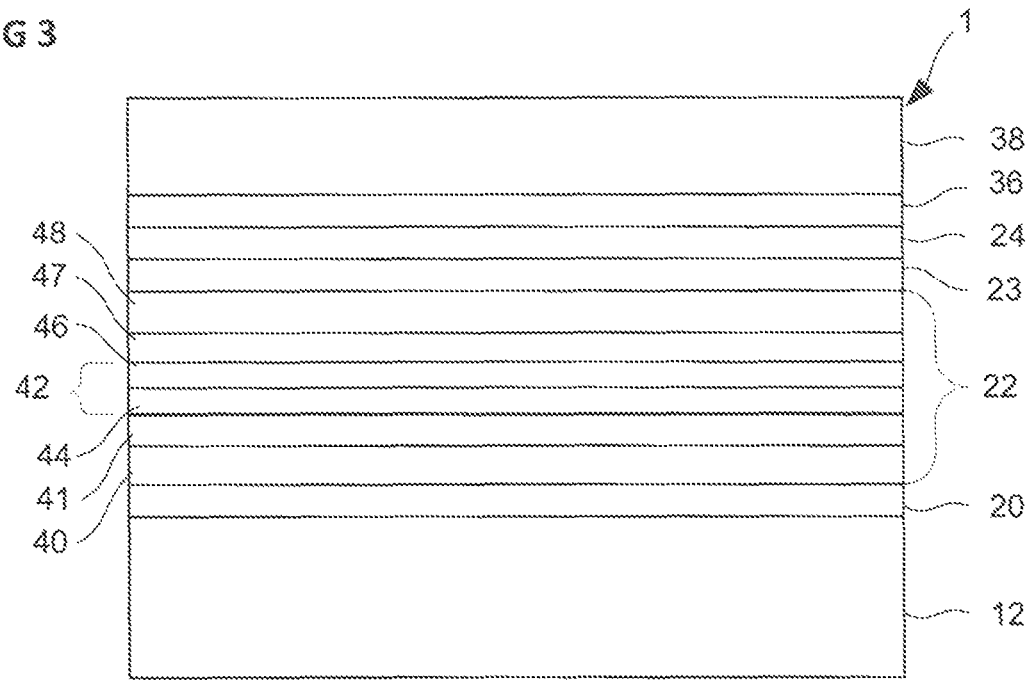
FIG. 3 shows an embodiment of a layer structure of an organic optoelectronic component.

FIG. 3 shows a sectional representation of an embodiment of a layer structure of an organic optoelectronic component 1, which may for example correspond substantially to the organic optoelectronic component 1 explained above.

The organic functional layer structure 22 includes a hole transport layer 40, a first emitter layer 41, a charge carrier pair generation layer 42 having a first sublayer 44 and having a second sublayer 46, a second emitter layer 47, and an electron transport layer 48. The first and/or second sublayers 44, 46 include nanostructures, which are respectively coated fully or partially with a coating material. The nanostructures and/or the coating material may be configured according to configurations of the nanostructures or coating material explained above. The nanostructures with the coating material in the charge carrier pair generation layer 42 may be arranged as an alternative or in addition to the nanostructures with the coating material in the first and/or second electrode 20, 23. The nanostructures and/or the coating material may be configured identically or differently in the charge carrier pair generation layer 42, the first electrode 20 and/or the second electrode 23.

Figure 4:
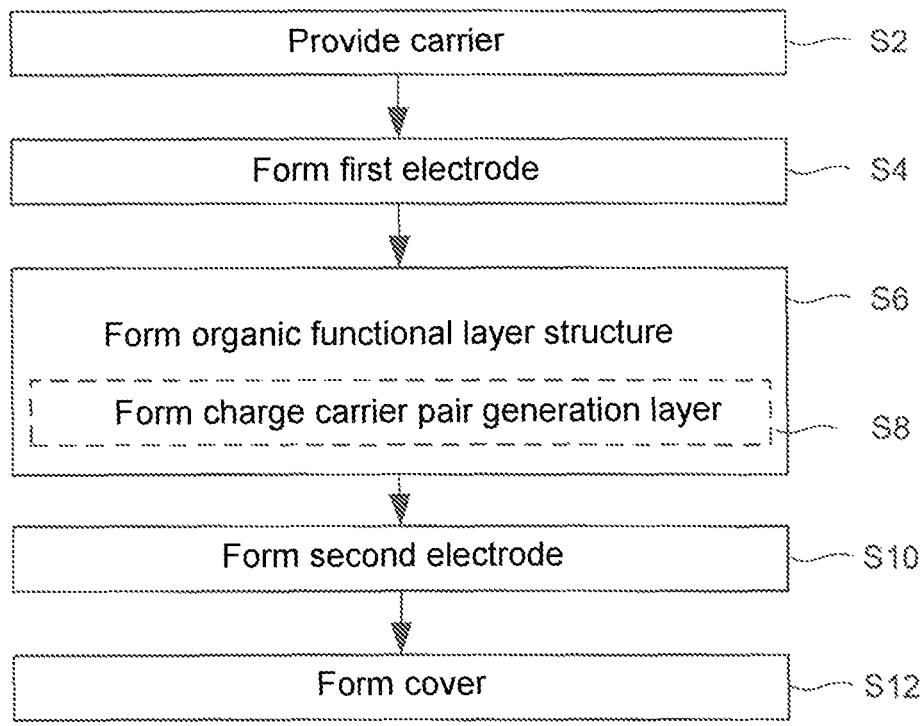
FIG. 4 shows a flowchart of an embodiment of a method for producing an organic optoelectronic component.

FIG. 4 shows a flowchart of an embodiment of a method for producing an organic optoelectronic component, for example one of the organic optoelectronic components 1 explained above.

In a step S2, a carrier is provided. For example, the carrier 12 explained above is provided, for example formed.

In a step S4, a first electrode is formed. For example, the first electrode 20 explained above is formed, for example over the carrier 12.

In a step S6, an organic functional layer structure is formed. For example, the organic functional layer structure 22 explained above is formed, for example over the first electrode 20.

In an optional step S8, a charge carrier pair generation layer structure is formed. For example, the charge carrier pair generation layer structure 42 may optionally be formed. The charge carrier pair generation layer structure 42 may, for example, be formed as a sublayer of the organic functional layer structure 22. In other words, the charge carrier pair generation layer 42 may be formed in the course of the formation of the organic functional layer structure 22. In other words, step S8 may be carried out as a substep of step S6. The charge carrier pair generation layer 42 may include the first and the second sublayer 44, 46. The first and the second sublayer 44, 46 may optionally be formed successively in corresponding substeps of step S8. The charge carrier pair generation layer 42 may, for example, be formed when two or more emitter layers 41, 47 are stacked on one another, in particular between the corresponding emitter layers 41, 47. The sublayers 44, 46 may, for example, be charge carrier pair generation layers of the CGL 42.

In a step S10, a second electrode is formed. For example, the second electrode 23 explained above is formed, for example over the organic functional layer structure 22.

In a step S12, a cover is formed. For example, the cover explained above, including encapsulation layer 24, the bonding layer 36 and/or the cover body 38, is formed.

In steps S4, S6 and/or S8, the first electrode 20, the charge carrier pair generation layer 42, or the second electrode 23, may be formed by using the nanostructures with the coating material, or the coating materials. Optionally, in corresponding preparatory steps, the nanostructures may be coated with the coating material. For example, during the coating of the corresponding nanostructures, the corresponding coating material may be present in solution and/or dissolved in a first liquid, for example in a first solvent. As an alternative or in addition, during their coating, the nanostructures may be present in solution and/or dissolved in a second liquid, for example in a second solvent. As an alternative or in addition, during the application of the nanostructures, the coated nanostructures may be present in solution and/or dissolved in a liquid, for example in a solvent, in which case the liquid may correspond to the first liquid or the second liquid, or a different third liquid.

The present disclosure is not restricted to the embodiments indicated. For example, the organic optoelectronic component 1 may include more or fewer layers. For example, the organic optoelectronic component 1 may include output and/or input coupling layers (not shown) which improve the efficiency of the organic optoelectronic component 1, and/or beam shaping layers (not shown) which influence the beam shape of the emitted light. As an alternative or in addition, the organic optoelectronic component 1 may be formed without the carrier 12 and/or without the entire cover or without a part of the cover. Furthermore, the method may include correspondingly more or fewer steps for forming the corresponding layers.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An organic optoelectronic component, comprising:
a first electrode,
an organic functional layer structure having a charge carrier pair generation layer structure, over the first electrode,
a second electrode over the organic functional layer structure,
wherein the charge carrier pair generation layer structure comprises a first sublayer having first nanostructures which are coated with a first coating material, and a second sublayer having second nanostructures which are coated with a second coating material, wherein the second sublayer is formed over the first sublayer, and wherein one of the two sublayers is a hole injection layer and the other of the two sublayers is an electron injection layer.

2. The organic optoelectronic component as claimed in claim 1, wherein the first and/or second nanostructures respectively comprise nanowires, nanotubes, nanoparticles and/or nanodots.

3. The organic optoelectronic component as claimed in claim 1, wherein the first coating material is configured to functionalize a surface of the first nano structures.

4. The organic optoelectronic component as claimed in claim 1, wherein the first coating material comprises organic compounds having one or more functional groups.

5. The organic optoelectronic component as claimed in claim 1, wherein a surface of the first nanostructures is functionalized by means of thiolalkyl.

6. The organic optoelectronic component as claimed in claim 1, wherein the first coating material comprises at least one functional group which is selected from aromatic, heteroaromatic, electron-withdrawing, electron donating, polar, nonpolar or fluorinated groups.

7. The organic optoelectronic component as claimed in claim 1, wherein the second coating material is configured to functionalize a surface of the second nanostructures.

8. The organic optoelectronic component as claimed in claim 1, wherein the second coating material comprises organic compounds having one or more functional groups.

9. The organic optoelectronic component as claimed in claim 1, wherein a surface of the second nanostructures is functionalized by means of thiolalkyl.

10. The organic optoelectronic component as claimed in claim 1, wherein the second coating material comprises at least one functional group which is selected from aromatic, heteroaromatic, electron-withdrawing, electron donating, polar, nonpolar or fluorinated groups.

11. A method for producing an organic optoelectronic component, the method comprising:
forming a first electrode,
forming an organic functional layer structure having a charge carrier pair generation layer structure, over the first electrode, and
forming a second electrode over the organic functional layer structure,
wherein the charge carrier pair generation layer structure comprises a first sublayer having first nanostructures which are coated with a first coating material, and a second sublayer having second nanostructures, which are coated with a second coating material, and wherein one of the two sublayers is a hole injection layer and the other of the two sublayers is an electron injection layer.

12. The method as claimed in claim 11, wherein forming the organic functional layer structure comprises dissolving the first or second coating material in a first liquid and then applying the dissolved first or second coating material respectively onto the the first and second nanostructures.

13. The method as claimed in claim 11, wherein forming the organic functional layer structure comprises dissolving the first or second nanostructures in a second liquid during the application of the respective coating material of the first and second coating materials.

14. The method as claimed in claim 11, wherein forming the organic functional layer structure comprises dissolving the first and/or second coated nanostructures in a liquid during the formation of the electrode or of the charge carrier pair generation layer structure.

* * * * *